(12) United States Patent
Lee et al.

(10) Patent No.: US 7,008,848 B2
(45) Date of Patent: Mar. 7, 2006

(54) MASK ROM FABRICATION METHOD

(75) Inventors: Woon-kyung Lee, Kyungki-do (KR); He-jueng Lee, Chungcheongnam-do (KR); Eui-do Kim, Kyungki-do (KR)

(73) Assignee: Sumsung Electronics Co., Ltd., Suwon-Si (KR)

( * ) Notice: Subject to any disclaimer, the term of this patent is extended or adjusted under 35 U.S.C. 154(b) by 92 days.

(21) Appl. No.: 10/713,117

(22) Filed: Nov. 17, 2003

(65) Prior Publication Data

US 2004/0097018 A1    May 20, 2004

Related U.S. Application Data

(62) Division of application No. 09/566,916, filed on May 9, 2000, now abandoned.

(30) Foreign Application Priority Data

May 10, 1999   (KR)   .................................. 99-16605

(51) Int. Cl.
    *H01L 21/8236*    (2006.01)

(52) U.S. Cl. ...................... 438/276; 438/278; 438/275; 438/258; 438/200

(58) Field of Classification Search ................ 438/276, 438/277, 278, 275, 257, 258, 201, 200
See application file for complete search history.

(56) References Cited

U.S. PATENT DOCUMENTS

| | | | |
|---|---|---|---|
| 4,219,836 A | 8/1980 | McElroy | |
| 5,119,165 A | 6/1992 | Ando | |
| 5,280,442 A | 1/1994 | Hotta et al. | |
| 5,418,175 A | 5/1995 | Hsue et al. | |
| 5,585,297 A * | 12/1996 | Sheng et al. | ................ 438/278 |
| 5,633,187 A | 5/1997 | Hsu | |
| 5,721,698 A | 2/1998 | Lee et al. | |
| 5,812,448 A | 9/1998 | Wen | |
| 5,846,865 A | 12/1998 | Sheng et al. | |
| 5,891,779 A * | 4/1999 | Chung et al. | ............... 438/276 |
| 5,891,780 A * | 4/1999 | Hasegawa et al. | .......... 438/278 |
| 6,118,160 A | 9/2000 | Wu | |

* cited by examiner

*Primary Examiner*—Michael Trinh
(74) *Attorney, Agent, or Firm*—Volentine Francos & Whitt P.L.L.C.

(57) ABSTRACT

A mask read only memory (ROM) and a method of fabricating the same is provided. This mask ROM and related method is capable of reducing the pitch of buried impurity diffusion regions. In the mask ROM fabrication process, a gate insulation layer is formed over a semiconductor substrate, and parallel conductive layer patterns are formed on the gate insulation layer. These conductive layer patterns are separated from each other by a first predetermined interval and extend in the same direction. Ion implantation is then carried out using the conductive layer patterns as a mask to form buried impurity diffusion regions near the semiconductor substrate between the conductive layer patterns. A conductive layer for use in forming word lines is then formed over the entire surface of the resultant structure, and both the conductive layer and the conductive layer patterns are etched so as to form word lines and pad conductive layers. The word lines are formed to be parallel to each other, are separated from each other by a second predetermined interval, and extend in a direction perpendicular to the buried impurity diffusion regions. The pad conductive layers, which form ohmic contacts with the word lines, are formed in an island shape channel regions. These channel regions are defined as the areas between the buried impurity diffusion regions that are overlapped by the word lines.

4 Claims, 10 Drawing Sheets

MASK ROM FABRICATION METHOD

CROSS REFERENCES TO RELATED APPLICATIONS

This application is a divisional of U.S. patent application Ser. No. 09/566,916 filed on 9 May 2000 now abandoned and claims priority under 35 U.S.C. 119 to Korean Application No. 99-16605, filed on 10 May 1999, and upon Korean Patent Application No. 00-3398, filed 25 Jan. 2000, the contents of both of which are hereby incorporated by reference in its entirety for all purposes.

BACKGROUND OF THE INVENTION

The present invention relates to a method of fabricating a semiconductor device, and more particularly, to a method of fabricating a mask read only memory (ROM) capable of effectively reducing the distance between buried impurity diffusion regions.

As the level of integration of semiconductor devices increases, the scaling-down of a pattern pitch, i.e., decreasing of the size of a line/space of a circuit, becomes an important consideration. Such a decrease in the size of a line/space of a circuit is achieved by developing photolithography technologies. The line/space of a circuit is determined by various factors, e.g., the resolution power of a photoresist used for manufacturing a pattern or wavelength of light (shorter wavelengths are favorable for fine patterns). Decreasing the size of the line/space of circuits, i.e., decreasing their pitch, is very important to create more highly integrated semiconductor devices, and is a trend that is likely to become more important in the future.

As mentioned above, a semiconductor device can be reduced in size by decreasing the wavelength of light used during a photoresist process for manufacturing the device. This wavelength of light is one of the important factors that determines the resolution power of a photoresist used for a photolithography process. Recently, the light used for photolithography has been changed from g-line, which has a wavelength of 436 nm, to i-line, which has a wavelength of 365 nm. Also, it is understood that KrF excimer lasers, which has a wavelength of 248 nm, will be used in the future. In addition, the resolution power of a photolithography process increases as the aperture of an exposure device used during the photolithography is enlarged as well as when the wavelength of incident light decreases.

However, if the size of a semiconductor device is reduced by the above-mentioned method, investment costs for equipment capable of producing a new generation semiconductor device increase logarithmically. Such a high-cost investment in the high integration of semiconductor devices becomes a burden to a manufacturer. As a result, much attention has been devoted to developing a method capable of increasing the degree of integration of a device, while minimizing investment costs.

FIG. 1 is a plan view of a cell array region of a NOR type mask ROM, and FIGS. 2 through 5 are sectional views taken along lines II–II', III–III', IV–IV' and V–V', respectively, of FIG. 1.

In FIGS. 1 through 5, reference numeral 10 represents a semiconductor substrate, reference numeral 11 represents a buried impurity diffusion region, reference numeral 12 represents a gate insulation layer, reference numeral 14 represents a word line (i.e., gate electrode), reference numeral 16 represents an insulation layer for protecting the gate electrode, reference numeral 18 represents an interlayer dielectric (ILD) film, reference numeral 20 represents a metal interconnection, reference numeral 22 represents an insulation layer for protecting the metal interconnection, reference numeral 24 represents a channel region of a cell, which requires programming and into which impurities are implanted to control the threshold voltage of the channel region.

The buried impurity diffusion regions 11, which are parallel to each other, are separated by a first predetermined distance. The word lines 14, which are parallel to each other and are separated by a second predetermined distance, are arranged perpendicular to the buried impurity diffusion regions 11. The metal interconnections 20 are arranged on and parallel to the buried impurity diffusion regions 11. Impurities are implanted into the channel region 24 of a cell that requires programming. The buried impurity diffusion regions 11 act as a source/drain for a cell transistor and as bit lines.

Referring to FIG. 1, each cell transistor is formed along one of the word lines 14. Portions of the buried impurity diffusion region 11 that are overlapped by the word lines 14 become sources/drains, and portions between the buried impurity diffusion regions 11 that are below the word lines 14 become channel regions.

Also, in order to increase the degree of integration of a given mask ROM, it is important to reduce its cell transistor area. For the purpose of reducing the cell transistor area, the pitch of the buried impurity diffusion regions 11 (see FIG. 1) and the pitch of the word lines 14 (see FIG. 1) must be reduced. However, there are the following considerations in achieving this.

First, to reduce the pitch of the buried impurity diffusion regions 11, a decrease in the length of the channel regions should be considered. In other words, reducing the pitch of the buried impurity diffusion regions 11 by photolithography is permitted when the punch-through margin of a cell transistor can be secured. Meanwhile, to reduce the pitch of the word lines 14, a decrease in width of the channel region 24 should also be considered. In other words, even though the pitch of the word line 14 can be reduced by photolithography, a drop in drain current according to the decrease in width of the channel regions should also be considered.

Furthermore, a decrease in the drain current requires another design consideration, such as a need to sense the margin of the bit lines. Thus, if the punch-through margin of the cell transistors can be secured, reducing the pitch of the buried impurity diffusion regions 11 is preferred, which provides many design advantages.

FIGS. 6 through 8 are sectional views illustrating a conventional method for manufacturing a mask ROM having buried impurity diffusion regions.

As shown in FIG. 6, a field oxide layer 34 is formed in an isolation region (between a cell array region and a peripheral circuit region, and between a p-channel region and an n-channel region) of a semiconductor substrate 30 using a common isolation process. Then, a thin oxide layer 36 is grown over the semiconductor substrate 30, and a photoresist is deposited over these layers. The photoresist is then developed to form a photoresist pattern 38, which is required to form buried impurity diffusion regions. Impurity ions 40 are then implanted into the resultant structure, using the photoresist pattern 38 as a mask, to form buried impurity diffusion regions 42 in the cell array region. The photoresist pattern 38 is formed such that it completely covers the peripheral circuit region and exposes only regions of the cell array region that are for buried impurity diffusion regions 42.

In forming the buried impurity diffusion regions 42, which are to be sources/drains of cell transistors and bit lines, it is important to secure a punch-through margin as well as a minimum achievable pitch using the current photolithography technique. To this end, it is important to increase the distance between the buried impurity diffusion regions rather than to increase the size of the buried impurity diffusion regions 42.

As the design rule decreases for highly integrated devices, the size of a bar "B" of the photoresist pattern 38 (which determines the length of the channel regions)may decrease to be less than a desired size, as a result of various limitations in the photolithography technology. In other words, because of a low resolution in a 5 photolithography technique using the minimum design rule, undesirable photoresist residues may remain on the buried impurity diffusion regions 42. As a result, an over-exposure process is required to remove these photoresist residues. Therefore, the size of a space "S" (which determines the size of the buried impurity diffusion regions) may increase to greater than a desired size, as the size of the bar "B" decreases to less than a desired size.

In order to secure the distance between the buried impurity diffusion regions 42 for an appropriate punch-through margin, the size of the bar "B" cannot be less than a marginal size limited by the photolithography process. Thus, the marginal size of bar "B" may hinder the reduction of cell size.

Subsequently, as shown in FIG. 7, the photoresist patterns 38 (see FIG. 6) and the thin oxide layer 36 are removed, and then a sacrificial oxidation process is carried out, and a gate insulation layer 37 is formed. Word lines 44 are then formed in the cell array region and gates 48 of peripheral devices are formed in the peripheral circuit region (see FIG. 7).

Then, as shown in FIG. 8, a first insulation layer 56 is formed over the entire surface of the resultant structure, and electrodes 58 and 60, which contact impurity diffusion regions 42 and 57 of the peripheral devices, are formed. A second insulation layer 62 is then deposited over the resultant structure. In FIGS. 6 and 8, reference numeral 32 represents an N-well, reference numerals 46 and 50 represent capping layers, and reference numeral 52 represents spacers.

The distance between the buried impurity diffusion regions 42 required for an appropriate punch-through margin is restricted by over-diffusion of the buried impurity diffusion regions, as well as by the limitations of the photolithography technique as described above with reference to FIGS. 6 through 8. In particular, reducing the distance between the buried impurity diffusion regions 42 is hindered due to auto doping and oxidation enhanced diffusion (OED) in the buried impurity diffusion regions 42. Auto doping is defined as a spontaneous diffusion of the impurity diffusion regions 42 due to a difference in the activation rate of the impurities in the regions.

Referring to FIG. 6, the buried impurity diffusion regions 42 are formed before the formation of the gate insulation layer 37 and the word lines (i.e., gates) 44, so that the impurities in the buried impurity diffusion regions 42 diffuse into the channel region by heat energy supplied during a subsequent gate insulation layer formation this has the effect of reducing the length of the channel regions. In general, the activation rate of n-type impurities is lower than that of p-type impurities under the same conditions. However, when the n-type impurities are doped with a high concentration of $10^{15}$ ions/cm$^2$, auto doping occurs in spite of its low activation rate. For example, in a buried impurity diffusion region doped with n-type impurities, diffusion of the n-type impurities into the channel region occurs by heat energy supplied during the formation of a gate insulation layer.

Also, in the conventional technique when the gate insulation layer 37 is formed after the formation of the buried impurity diffusion regions 42, OED occurs because of a segregation factor during the formation of the gate insulation layer 37. This facilitates the diffusion of the n-type impurities into the substrate. As a result, the buried impurity diffusion regions 42 doped with the n-type impurities may extend to the channel region.

The reason why there are two types of diffusion is that the buried impurity diffusion regions are formed prior to the formation of the gate insulation layer.

SUMMARY OF THE INVENTION

To solve the above problems, it is an object of the present invention to provide a mask read only memory (ROM), in which the over-diffusion of buried impurity diffusion regions is suppressed, so that the distance of the buried impurity diffusion regions can be minimized to a marginal level defined by photolithography, while maintaining an appropriate punch-through margin.

Another object of the present invention is to provide a method of fabricating such a mask ROM.

According to an aspect of the present invention, a mask read only memory is provided. This mask ROM comprises a semiconductor substrate, a plurality of buried impurity diffusion regions formed in the semiconductor substrate and near the surface of the semiconductor substrate, each of the plurality of buried impurity diffusion regions being parallel to each other, being separated from each other by a first predetermined interval, and extending in the same direction, a plurality of word lines formed over the semiconductor substrate, the word lines being to each other, being separated from each other by a second predetermined interval, and extending in a direction perpendicular to the direction that the buried impurity diffusion regions extend, a gate insulation layer formed between the semiconductor substrate and the plurality of word lines, a plurality of channel regions defined by the areas between the buried impurity diffusion regions that are overlapped by the word lines, and a plurality of pad conductive layers formed in the channel regions, the pad conductive layers forming an ohmic contact with the word lines.

The plurality of buried impurity diffusion regions may act as bit lines and as sources/drains of cell transistors, and the word lines may act as gate electrodes of the cell transistors. The pad conductive layers are preferably formed to have an island shape in the channel regions. The word lines preferably comprise a polycide layer in which a polysilicon layer and a metal silicide layer are stacked, and the pad conductive layers preferably comprise polysilicon.

The pad conductive layers are preferably formed to a thickness of about 300–1000 Å. The grown insulation layers preferably have a thickness of about 100–1000 Å.

The read only memory may further comprise grown insulation layers formed over the surface of the buried impurity diffusion regions. The grown insulation layers may have horn portions at their edges.

The buried impurity diffusion regions are preferably formed to have a double diffusion drain (DDD) structure in which high-concentration buried impurity diffusion regions are surrounded by low-concentration buried impurity diffusion regions.

According to another aspect of the present invention, a method is provided for fabricating a mask read only memory. The method comprises forming a gate insulation layer over a semiconductor substrate, forming a plurality of conductive layer patterns over the gate insulation layer, the conductive layer patterns being formed in parallel, being separated from each other by a first predetermined interval, and extending in the same direction, performing ion implantation, using the conductive layer patterns as a mask, to form buried impurity diffusion regions in an exposed region of the semiconductor substrate between the conductive layer patterns, forming a conductive layer over the conductive layer patterns and the buried impurity diffusion regions, and etching the conductive layer and the conductive layer patterns to form a plurality of word lines and a plurality of pad conductive layers. Preferably the word lines are formed in parallel, are separated from each other by a predetermined interval, and extend in a direction perpendicular to the buried impurity diffusion regions. Channel regions are defined by the areas between the buried impurity diffusion regions that are overlapped by the word lines. And preferably, the pad conductive layers are formed to have an island shape in the channel regions, and form ohmic contacts with the word lines.

The forming of the buried impurity diffusion regions may further comprise implanting impurity ions at a low concentration into semiconductor substrate using the conductive layer patterns as a mask, to form low-concentration buried impurity diffusion regions that are self-aligned with the conductive layer patterns, simultaneously forming spacers on the sidewalls of the conductive layer patterns and removing exposed portions of the gate insulation layer, so as to partially expose the low-concentration buried impurity diffusion regions, and implanting impurity ions at a high concentration into semiconductor substrate, using the conductive layer patterns and the spacers as a mask, to form high-concentration buried impurity diffusion regions in the low-concentration buried impurity diffusion regions. The grown insulation layers are preferably formed to a thickness of about 100–1000 Å.

The high-concentration impurity implantation, arsenic (As) ions are preferably implanted at an energy of about 40 keV to a dose of about $5.0 \times 10^{15}$ ions/cm$^2$.

The method may further comprise oxidizing the exposed surface of the semiconductor substrate to form grown insulation layers over the surface of the high-concentration buried impurity diffusion regions.

The forming of the conductive layer patterns may comprise forming a conductive material layer over the gate insulation layer; forming an etch mask layer on the conductive material layer; forming spacers on the sidewalls of the etching mask layer; and etching the conductive material layer using the etching mask layer and the spacers as an etching mask to form the conductive layer patterns. In this case, the forming of the buried impurity diffusion regions comprises implanting impurities over the entire surface of the resultant structure using the etch mask layer, the spacers, and the conductive layer patterns as a mask, to form buried impurity diffusion regions in an exposed region of the semiconductor substrate.

The method of fabricating a mask read only memory may further comprise, after the forming of the buried impurity diffusion regions, oxidizing the exposed surface of the semiconductor substrate to form grown insulation layers over the surface of the buried impurity diffusion regions. The grown insulation layers are preferably formed to have a thickness of about 100–1000 Å.

The pad conductive layers preferably comprise a material capable of forming the ohmic contacts with the word lines. More specifically, the pad conductive layers preferably comprise polysilicon, and the word lines preferably comprise a polycide layer in which a polysilicon layer and a metal silicide layer are stacked.

In another embodiment, a method is provided for fabricating a mask read only memory. This method comprises forming a gate insulation layer over a semiconductor substrate, forming a first polysilicon layer over the gate insulation layer, forming photoresist patterns over the first polysilicon layer, which entirely cover a peripheral circuit region but are patterned in a cell array region to expose regions that are to become buried impurity diffusion regions, performing ion implantation using the photoresist patterns as a mask to form a plurality of buried impurity diffusion regions near the surface of the semiconductor substrate, wherein the buried impurity diffusion regions are formed in parallel, are separated from each other by a first predetermined interval, and extend in the same direction, removing the photoresist patterns, and sequentially stacking a second silicon layer and a metal silicide layer over the first polysilicon layer, and sequentially etching the first and second polysilicon layers and the metal silicide layer so as to form a plurality of word lines, wherein the word lines are formed in parallel, are separated from each other by a second predetermined interval, and extend in a direction perpendicular to that of the buried impurity diffusion regions.

The buried impurity diffusion regions preferably act as bit lines and as sources/drains of cell transistors. The method may further comprise doping first and second polysilicon layers with POCl$_3$ ions so as to provide conductivity to the first and second polysilicon layers.

Preferably, the gate insulation layer is formed to a thickness of about 50–150 Å, the first polysilicon layer is formed to a thickness of about 100–1000 Å, the second polysilicon layer is formed to a thickness of about 500–1500 Å, and the metal suicide layer is formed to a thickness of about 500–2000 Å.

Therefore, according to the present invention, the area of the cell array region can be effectively reduced, and a parasitic capacitance between the word lines and the semiconductor substrate, the sheet resistance of the buried impurity diffusion regions, and the parasitic junction capacitance between the semiconductor substrate and the buried impurity diffusion regions, can all be reduced.

BRIEF DESCRIPTION OF THE DRAWINGS

The above object and advantages of the present invention will become more apparent by describing in detail preferred embodiments thereof with reference to the attached drawings in which.

DESCRIPTION OF THE PREFERRED EMBODIMENTS

The present invention is directed to a mask read only memory (ROM), and a method of fabricating the same, which avoids a reduction of the length of channel regions caused by the over-diffusion of the buried impurity diffusion regions. As a result of this, the mask ROM of the present invention maintains the distance of the buried impurity diffusion regions at a minimum level. Thus, a highly integrated cell having a channel length of about 0.15 μm can be obtained.

First Preferred Embodiment

Figure 1:
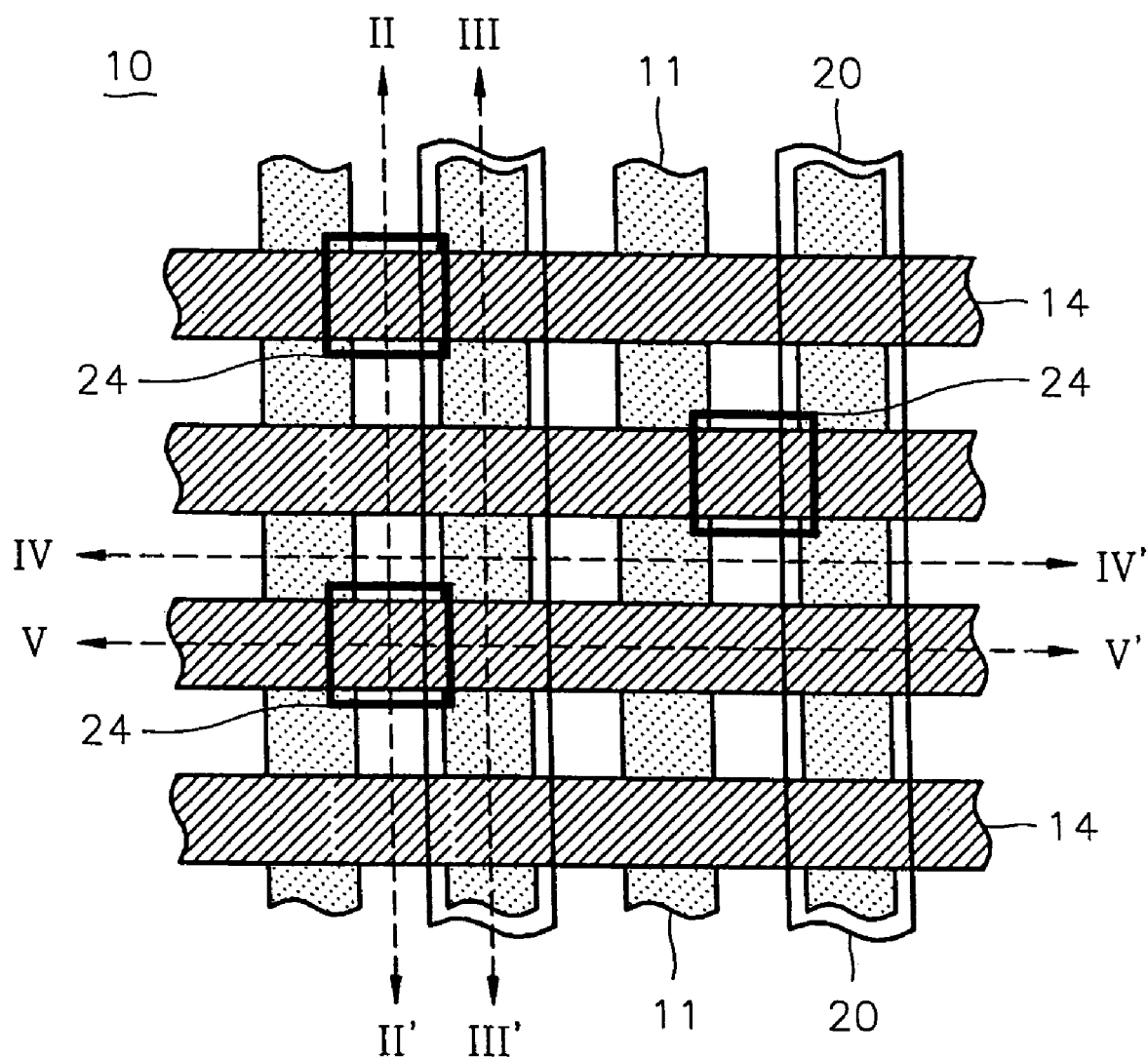
FIG. 1 is a plan view of a cell array region of a NOR type mask ROM.
Figure 2:
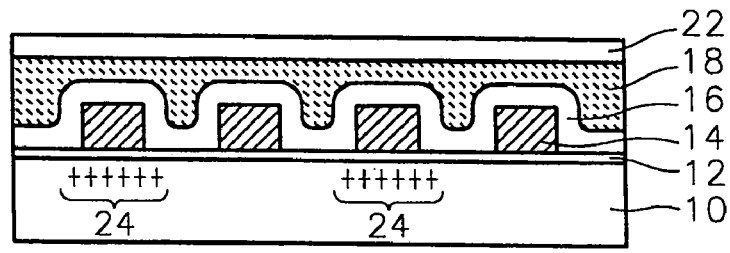
FIGS. 2 through 5 are sectional views taken along lines II–II', III–III', IV–IV' and V–V' of FIG. 1, respectively.
Figure 3:
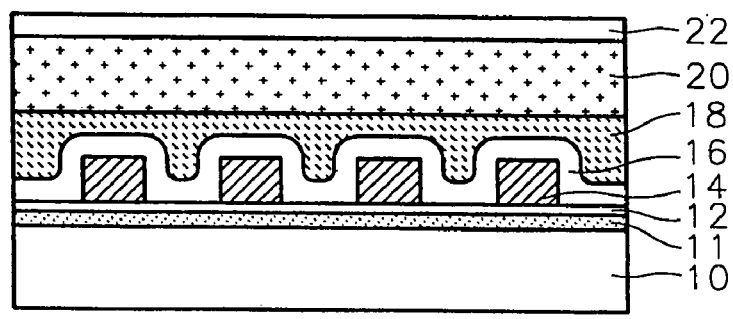
Figure 4:
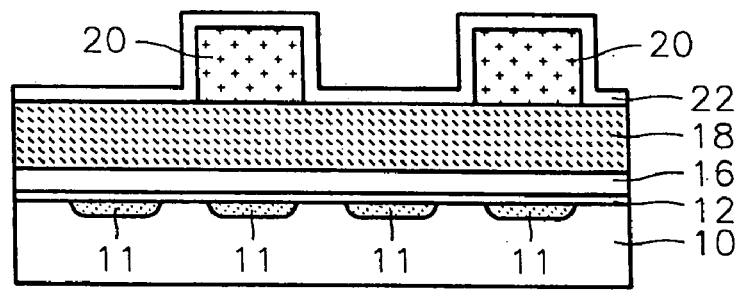
Figure 5:
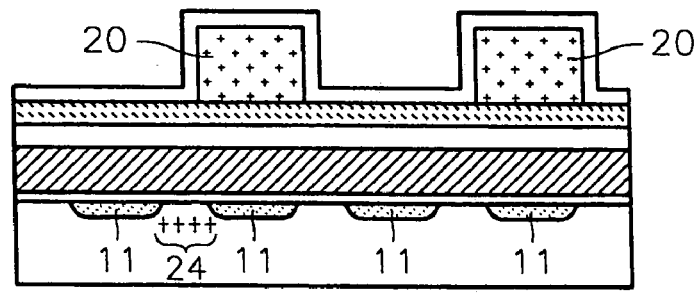
Figure 6:
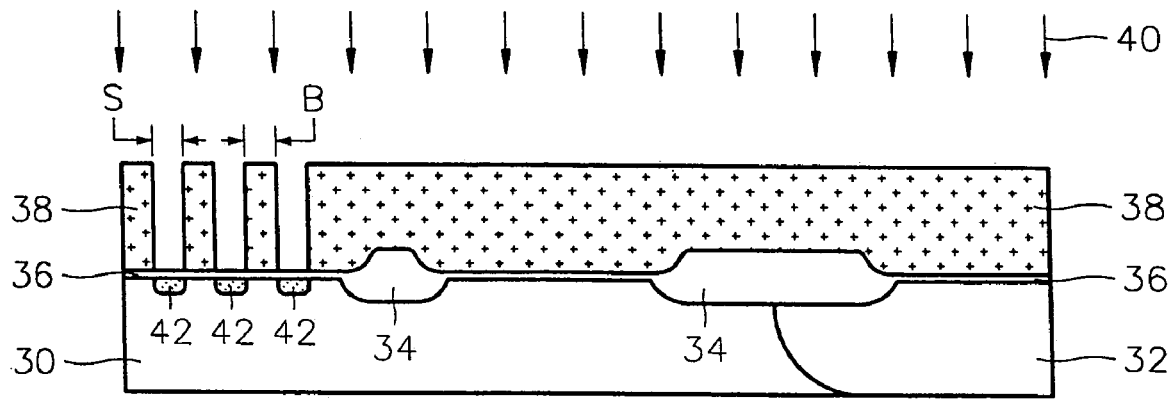
FIGS. 6 through 8 are sectional views illustrating a conventional method of fabricating a mask ROM having buried impurity diffusion regions.
Figure 7:
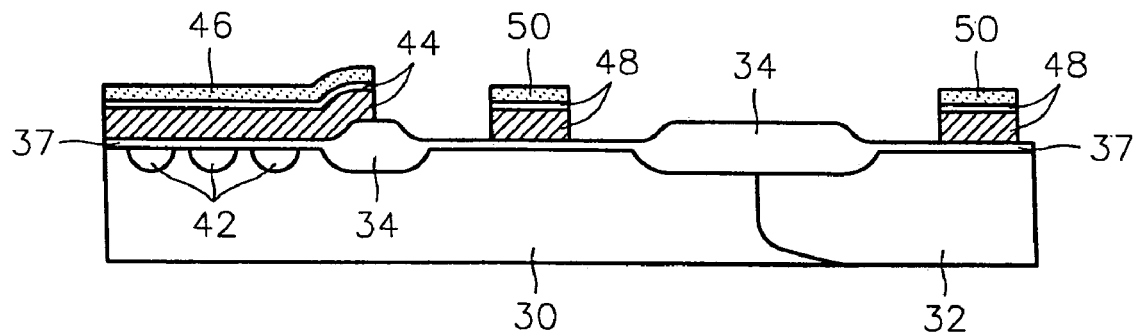
Figure 8:
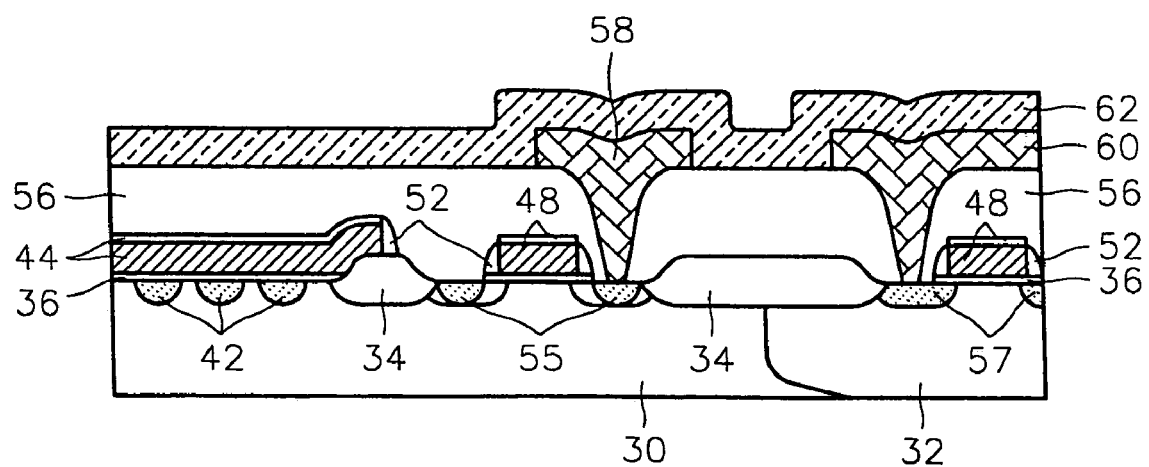
Figure 9:
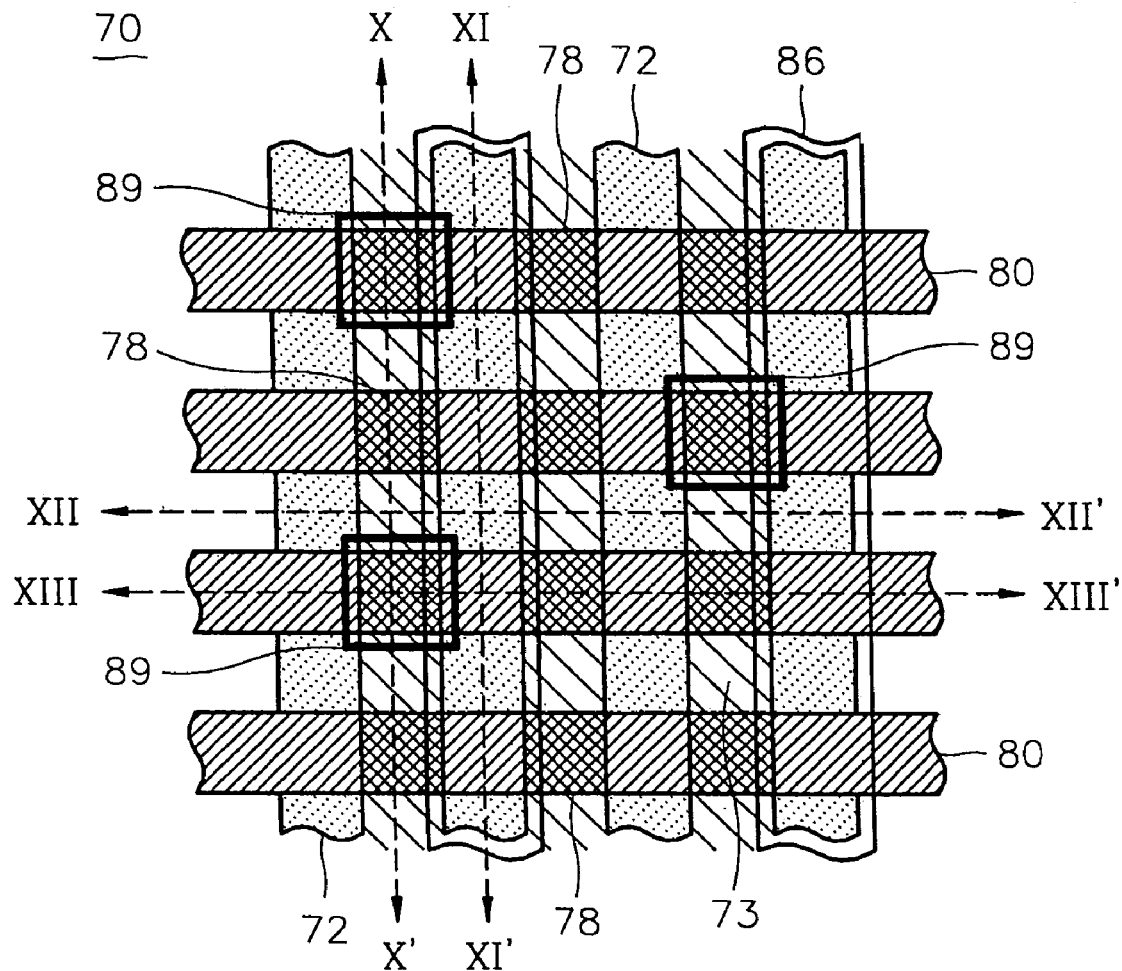
FIG. 9 is a plan view of a cell array region of an NOR type mask ROM according to a first preferred embodiment of the present invention.
Figure 10:
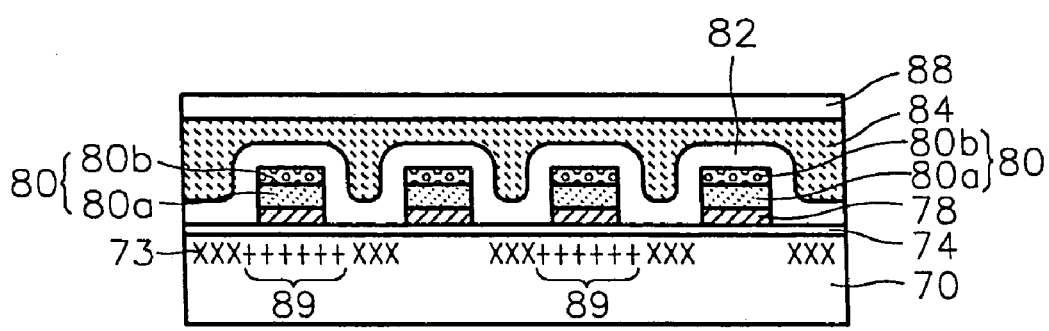
FIGS. 10 through 13 are sectional views taken along lines X–X', XI–XI', XII–XII' and XIII–XIII' of FIG. 9, respectively.
Figure 11:
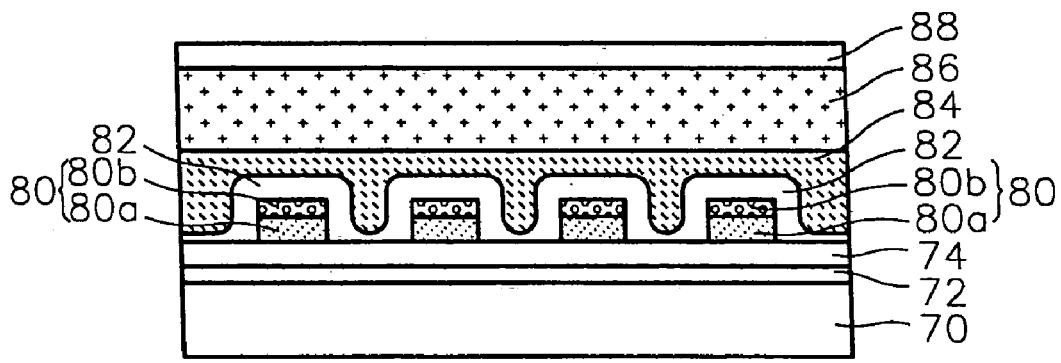
Figure 12:
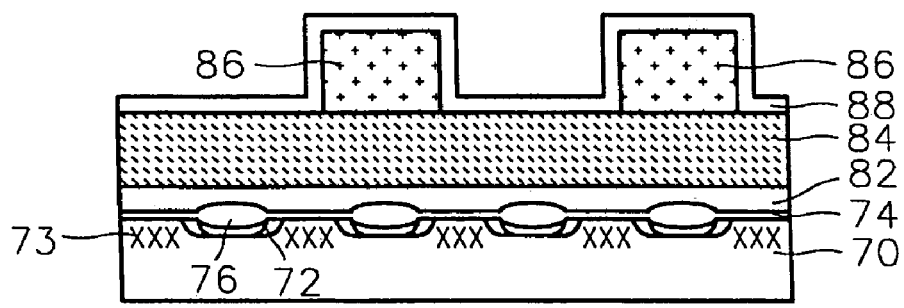

FIG. 9 is a plan view of a cell array region of a NOR type mask ROM according to preferred embodiments of the present invention, and FIGS. 10 through 13 are sectional views taken along lines X–X', XI–XI', XII–XII' and XIII–XIII' of FIG. 9, respectively.

FIGS. 9 through 13, reference numeral 70 represents a semiconductor substrate, reference numeral 72 represents a buried impurity diffusion region, reference numeral 74 represents a gate insulation layer, reference numeral 76 represents a grown insulation layer, reference numeral 78 represents a pad conductive layer, reference numeral 80 represents a word line (i.e., a gate), reference numeral 82 represents a gate protective insulation layer, reference numeral 84 represents a planarization layer, reference numeral 86 represents a metal interconnection, reference numeral 88 represents a metal interconnection protective insulation layer, reference numeral 89 represents a channel region of a cell, which requires programming and into which impurities are implanted to control the threshold voltage of channel regions. The word line 80 may be formed of two layers, a polysilicon layer 80a and a metal silicide layer 80b.

The buried impurity diffusion regions 72 are arranged as parallel bar shapes, which are preferably separated from each other by a first predetermined interval. The word lines 80, are also arranged in parallel and are preferably separated from each other Cell isolation impurity layers 73 for enforcing the isolation between the cell transistors, are preferably formed in the regions of the buried impurity diffusion regiosn 72 that are not overlapped by the pad conductive layers 78.

The buried impurity diffusion regions 72 preferably act as bit lines, and regions of the buried diffusion regions 72 that are overlapped by the word lines 80 act as sources/drains of cell transistors that are formed along the word lines 80. Also, regions between the parallel buried diffusion regions 72 that are not overlapped by the word lines 80 act as the channel regions of the cell transistors.

When using a NOR type mask ROM to read programmed data from a particular cell, the ROM is preferably operated as follows. A voltage of preferably 0–2V is applied to the bit lines connected to the particular cell while a high voltage is applied to the word lines 80 of the particular cell, and the bit lines adjacent to the particular cell, i.e., not connected to the cell, are grounded. If the threshold voltage of the channel region of the particular cell is programmed to be higher than the "high voltage" applied to the word lines 80, the cell is determined to be an "off-cell" in which discharge of the bit lines is prevented. Meanwhile, if the threshold voltage of the particular cell is programmed to be lower than the "high voltage" applied to the word lines 80, the cell is determined to be an "on-cell." Each bit line is preferably connected to the source of a select transistor (not shown) formed at the edge of the buried impurity regions 72, and a voltage is supplied to the buried impurity diffusion regions 72 by the operation of the select transistor.

In general, the cells are programmed into two states, i.e., the threshold voltage of the channel region of each cell is programed to be higher or lower than the voltage applied to the gate electrode of that cell. Controlling the threshold voltage of the channel region is performed by impurity implantation into the channel region 89 (see FIG. 9).

Figure 13:
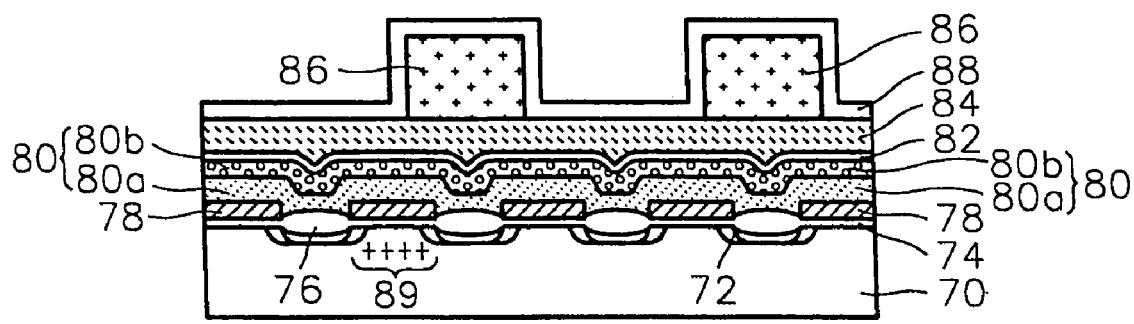

As shown in FIG. 13, the buried impurity diffusion regions 72 are preferably formed to be self-aligned with the pad conductive layer 78, and the length of the channel regions is determined by the width of the pad conductive layers 78.

The pad conductive layers 78 are preferably formed of a material that is capable of forming an ohmic contact with the word lines 80. For example, if the word lines 80 are formed of a polycide layer, in which a polysilicon layer and a metal silicide layer are deposited, the pad conductive layers 78 may be formed of polysilicon. The metal in such a metal silicide layer of the word lines 80 is preferably tantalum (Ta), titanium (Ti), tungsten (W) or cobalt (Co). Also, the pad conductive layers 78 are preferably formed to have a thickness of about 300–1,000 Å.

The buried impurity diffusion regions 72 preferably have a double diffusion drain (DDD) structure in which both a low-concentration diffusion region and a high-concentration diffusion region are present. The high-concentration buried impurity diffusion region has a concentration of about 1020 atoms/cm$^3$. In the preferred embodiments, the high-concentration buried impurity diffusion region is surrounded by the low-concentration buried impurity diffusion region. This operates to reduce a parasitic junction capacitance, which is present between a semiconductor substrate and the buried impurity diffusion regions 72. Also, since the concentration of the high-concentration buried impurity diffusion region can be increased to the concentration of $10^{20}$ atoms/cm$^3$, the sheet resistance of the buried impurity diffusion regions can also be decreased.

The grown insulation layers 76 are preferably formed over the buried impurity diffusion regions 72 while the gate insulation layers 74 are preferably formed over a semiconductor substrate 70 between the buried impurity diffusion regions 72. Both the grown insulation layer 76 and the gate insulation layer 74 are preferably formed of silicon dioxide, which is comprised of silicon and oxygen atoms, and these layers preferably have a thickness of about 100–1000 Å and about 50–150 Å, respectively.

The grown insulation layer 76 may be formed over the entire surface of the buried impurity diffusion regions 72, or only over the buried impurity diffusion region 72 that are overlapped by the word lines 80. The final shape of the grown insulation layers 76 is determined by a subsequent etching process that follows the word line formation. Also, if the grown insulation layer 76 exists at least between the buried impurity diffusion regions 72 and the word lines 80, the parasitic capacitance between these two can be reduced.

Although not illustrated, cell isolation impurity layers for enforcing the isolation between the cell transistors, are preferably formed in the regions of the buried impurity diffusion regions 72 that are not overlapped by the pad conductive layers 78.

FIGS. 14 through 21 are sectional views sequentially illustrating a method of manufacturing a mask ROM having buried impurity diffusion regions according to a first preferred embodiment of the present invention, in which like reference numerals are used to refer to like elements. Impurity types, i.e, n-type or p-type that are mentioned in describing a semiconductor substrate and impurity diffusion regions as well as specific numerical values given are intended to be illustrative, and should not be taken as limiting.

Figure 14:
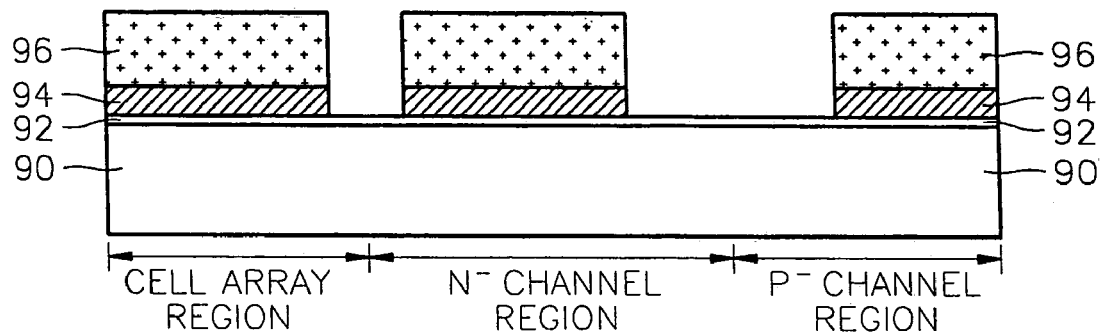
FIGS. 14 through 21 are sectional views sequentially illustrating a method of fabricating a mask ROM having buried impurity diffusion regions according to a first preferred embodiment of the present invention.

Referring to FIG. 14, a pad oxide layer 92 and a silicon nitride layer 94 are sequentially stacked over the surface of a p-type semiconductor substrate (or p-type well) 90. A first photoresist pattern 96 is then formed over the silicon nitride layer 94. The first photoresist pattern preferably has holes that expose isolation regions (i.e., regions between a cell array region (represented by the label "CELL ARRAY REGION") and peripheral circuit regions (represented by the labels "N-CHANNEL REGION" and "P-CHANNEL REGION"), and regions between the n-channel and p-channel.

The silicon nitride layer 94 is then etched using the first photoresist pattern 96 as an etching mask, to expose the pad oxide layer 92 of the isolation regions. The cell array regions are protected by the silicon nitride layer 94.

Figure 15:
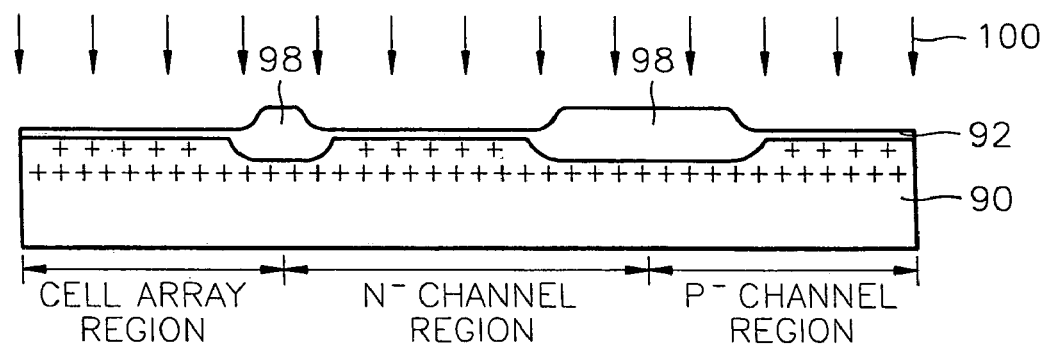

Referring to FIG. 15, field oxide layers 98 are formed in the isolation regions through oxidation to define the active regions and non-active regions. (The non-active regions refer to the regions having the field oxide layers 98.) Then, in order to enforce the isolation of an n-channel field, p-type impurities 100, e.g., boron (B) ions, are implanted into the entire surface of the resultant structure, preferably at an implantation energy of 130 keV to a dose of about $1.0 \times 10^{13}$ ions/cm$^2$. During the ion implantation, the field oxide layer 98 is used as a mask. Subsequently, in order to control the threshold voltage of the n-channel regions, impurities, e.g., $BF_2$ ions, are implanted, preferably at an energy of 50 keV to a dose of $2.4 \times 10^{12}$ ions/cm$^2$.

Figure 16:
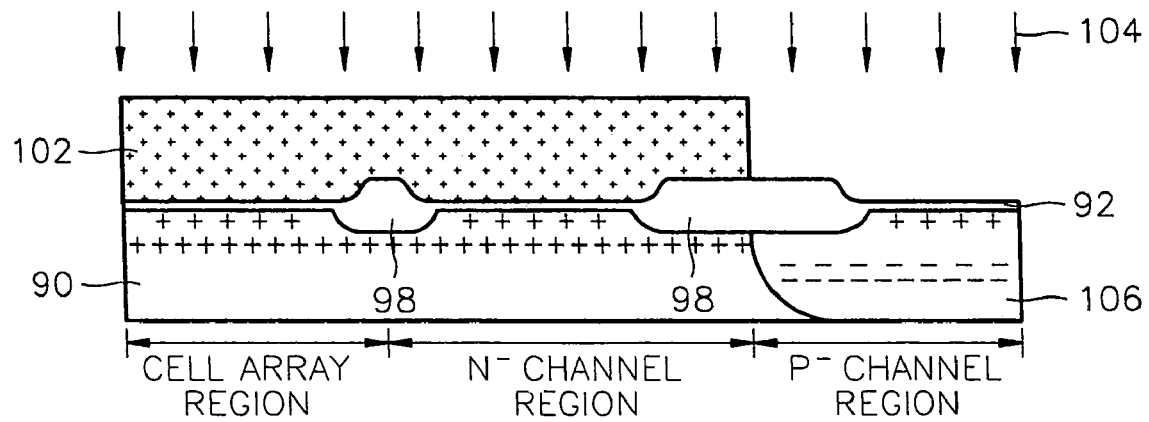

Referring to FIG. 16, a second photoresist pattern 102 that covers the cell array region and the n-channel region is formed, and then n-type impurities 104, for example, phosphorous (P) ions, are implanted, preferably at an energy of about 800 keV, to form an N well 106 in the p-channel region. Although not shown n-type impurities, such as P ions, are subsequently implanted, preferably at an energy of about 280 keV, in order to enhance the isolation of a p-channel field. Then, n-type impurities, e.g., arsenic (As) ions, are implanted, preferably at an energy of about 180 keV, to form a channel barrier layer (not shown) for preventing a bulk punch-through of the N well 106. Then, although not illustrated, impurities, such as $BF_2$ ions, are implanted in order to control the threshold voltage of the p-channel region.

Figure 17:
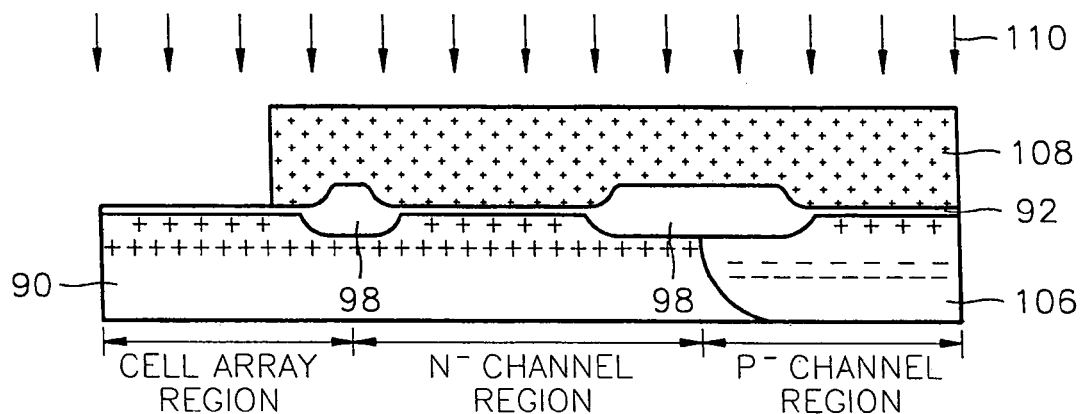

Referring to FIG. 17, after the second photoresist pattern 102 (see FIG. 16) is removed, a third photoresist pattern 108, which exposes only the cell array region, is formed. Impurities 110, such as, $BF_2$ ions, are then implanted, preferably at an energy of about 50 keV to a dose of about $2.5 \times 10^{12}$ ions/cm$^2$ in order to control the threshold voltage of the cell transistor.

The ion implantation sequence, types of impurities, implantation energy, and doses that are mentioned during the description with reference to FIGS. 15 through 17, may be arbitrarily controlled taking into account the desired electrical characteristics of a desired resulting device.

Figure 18:
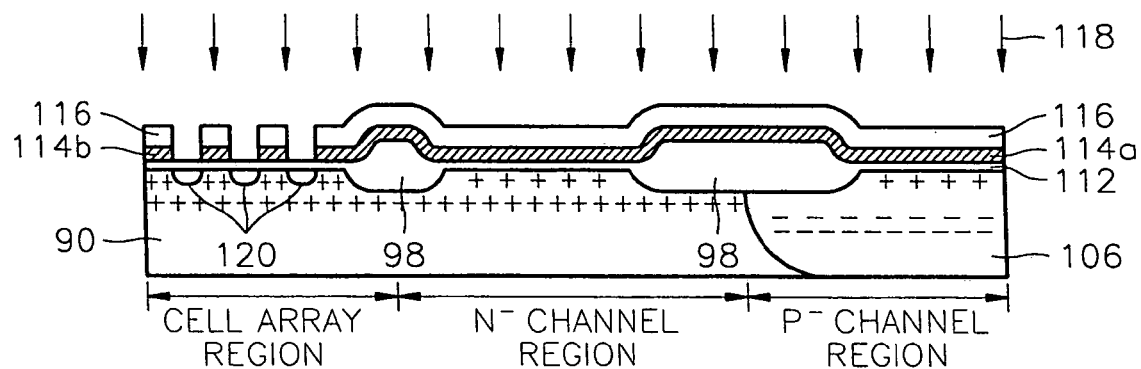

Referring to FIG. 18, after the third photoresist pattern 108 (see FIG. 17) and the pad oxide layer 92 (see FIG. 17) are removed, a sacrificial oxidation process is carried out to form and then remove an oxide layer on and from the entire resultant surface. This process is carried out to remove any defects that may be present on the surface of the semiconductor substrate 90. A gate insulation layer 112 is then formed over the resultant structure. The gate insulation layer 112 is preferably formed of silicon dioxide having a thickness of about 50–150 Å. A layer of polysilicon, for example, is then deposited over the gate insulation layer 112 to a thickness of about 300–1500 Å, to form a conductive material layer (which is then etched into patterns 114a and 114b) for use as a pad conductive layer.

Subsequently, a first etch mask layer (which will be etched into first etch mask layer patterns 116) is formed over the conductive material layer. Preferably, the first etch mask layer comprises silicon nitride. Then, both the first etch mask layer and the underlying conductive material layer are subjected to a photolithography process, using a mask (not shown) with a pattern such as the pattern 72 of FIG. 9, as a mask (not shown). As a result of this process, bar-shaped conductive layer patterns 114b, which extend in the vertical direction in FIG. 9, are formed in the cell array region, while a conductive barrier layer 114a, which covers the entire peripheral circuit region, is formed in the peripheral circuit region. Preferably, this etching process is performed to minimize the loss of thickness of the gate insulation layer 112.

N-type impurities such as ions are then implanted into the entire surface of the resultant structure, preferably at an energy of about 60 keV to a dose of about $1.6 \times 10^{13}$ ions/cm$^2$, to form low-concentration buried impurity diffusion regions 120. The low-concentration buried impurity diffusion regions 120 are preferably self-aligned with the conductive layer patterns 114b, near the semiconductor substrate 90 between the conductive layer patterns 114b. As a result of this, the low-concentration buried impurity diffusion regions 120 are formed as parallel bar shapes that extend in the vertical direction of FIG. 9, and are parallel to the conductive layer patterns 114b.

Figure 19:
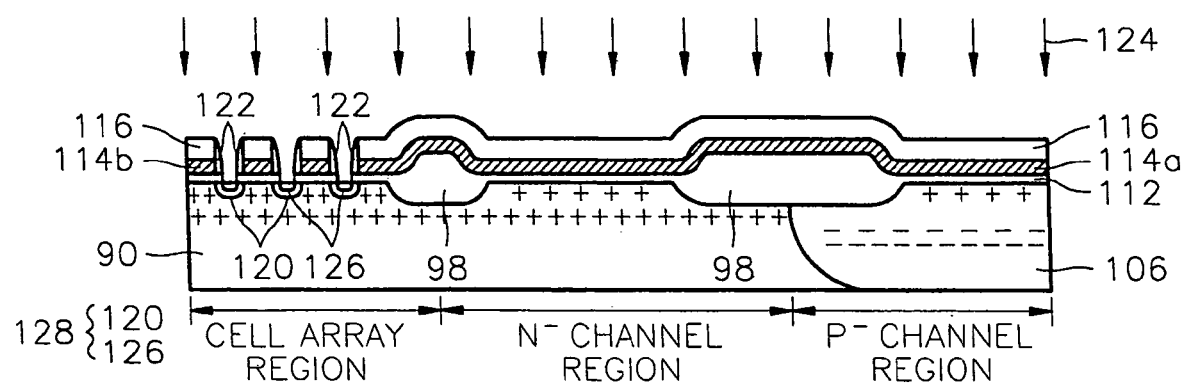

Referring to FIG. 19, silicon nitride is deposited over the entire surface of the substrate to a thickness of, e.g., 100–500 Å. The silicon nitride is then subjected to an etchback process to form spacers 122 on the sidewalls of the conductive layer patterns 114b. During this etchback process, the silicon nitride layer is preferably over-etched to remove the remaining gate insulation layer 112, so that the semiconductor substrate 90 is exposed. This provides for better doping uniformity in a subsequent formation of high-concentration buried impurity diffusion regions.

The resultant structure is then implanted with n-type impurities such as ions, preferably at an energy of about 40 keV to a dose of about $5.0 \times 10^{15}$ ions/cm$^2$, to form high-concentration buried impurity diffusion regions 126 inside the low-concentration buried impurity diffusion regions 120. The high-concentration buried impurity diffusion regions 126 are preferably self-aligned with the spacers 122.

Exposing the semiconductor substrate by etching the gate insulation layer before the implantation process for the high-concentration buried impurity diffusion regions 126, is done to lower the implantation energy and to minimize the reduction of the length of the channel regions due to lateral scattering of impurity ions. Preferably, the atoms are implanted at an energy of about 40 keV to a dose of about $5.0 \times 10^{15}$ ions/cm$^2$. This compares to a conventional process which carries out a lower dose of about $1.0 \times 10^{15}$ ions/cm$^2$ to prevent the expansion of the buried impurity diffusion regions due to the lateral scattering by a high implantation energy. In the present preferred embodiment, the impurity concentration of the high-concentration buried impurity diffusion regions 126 can be raised (to about $10^{20}$ atoms/cm$^2$), which will in turn lower the sheet resistance of the buried impurity diffusion regions 128 (including the low-concentration buried impurity diffusion regions 120 and the high-concentration buried impurity diffusion regions 126).

In the present preferred embodiment, buried impurity diffusion regions 128 for the cell transistors are formed after the gate insulation layer 112 is formed. As a result, this avoids the diffusion of impurity ions (i.e., auto doping) into the buried impurity diffusion regions 128, caused by the heat energy provided during the formation of the gate insulation layer 112. In addition, this prevents the diffusion of the impurity ions of the n-type buried impurity diffusion regions into the substrate due to oxidation enhanced diffusion (OED) during the gate insulation layer 112 formation. As a result, this minimizes the pitch of the buried impurity diffusion regions 128 to a limit level of the photolithography process.

Also, by forming the buried impurity diffusion regions 128 in a DDD structure, in which the high-concentration impurity diffusion regions 126 are surrounded by the low-concentration buried impurity diffusion regions 120, the parasitic junction capacitance between the semiconductor substrate 90 and the buried impurity diffusion regions 128 can be reduced.

Figure 20:
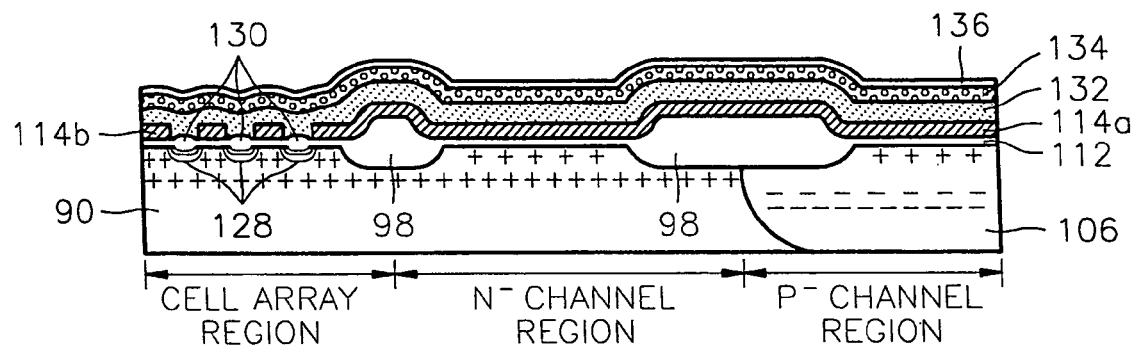

Referring to FIG. 20, an oxide layer made of silicon dioxide is preferably grown over the exposed high-concentration buried impurity diffusion regions 126, resulting in a grown insulation layer 130. The insulation layer 130 is preferably formed over the substrate, which has a certain degree of lattice damage. This occurs during the implantation for the buried impurity diffusion regions, so that the growth rate of this process is higher compared to other growing processes.

In the present preferred embodiment, the growth insulation layer 130 is formed to a thickness of about 100–1000 Å. Also, the sidewalls and the top of the conductive layer patterns 114b are capped by the spacers 122 (see FIG. 19) and the first etch mask layer patterns 116 (see FIG. 19), respectively, so there is no possibility of the oxide layer growing on these layers. After the grown insulation layer 130 is formed, the spacers 122 and the first etch mask layers 116 are removed, preferably using phosphoric acid having a high selectivity to silicon nitride.

A conductive material capable of forming an ohmic contact with the conductive layer patterns 114b, e.g., polysilicide, is then deposited over the entire surface of the resultant structure to form a conductive layer for the word lines. The conductive material is preferably formed of a polysilicon layer 132 and a metal silicide layer 134. Then, a second etch mask layer 136 is formed over the conductive material (layers 132 and 134).

In order to provide conductivity to the polysilicon layers of the conductive patterns 114b and for the word lines, the deposition of the polysilicon layer 132 is preferably followed by doping with impurity ions, e.g., POCl$_3$ ions.

Figure 21:
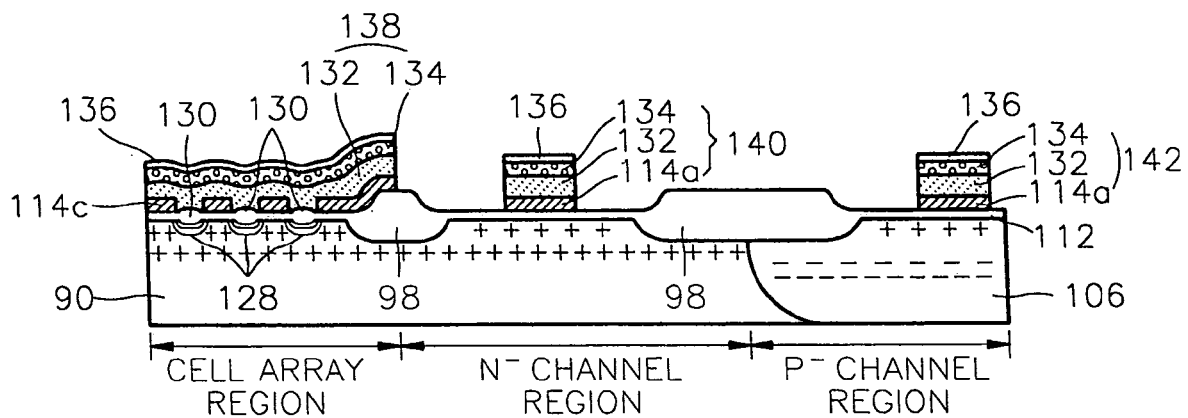

Referring to FIG. 21, the second etch mask layer 136 and the layers beneath the second etch mask layer, i.e., the conductive material layers for the word lines, and the conductive layer patterns 114b, are sequentially etched via photolithography processes. This process uses a mask (not shown) with a pattern for the word lines 80 (see FIG. 9) to form word lines 138 and pad conductive layers 114c. The word lines 138 preferably extend as bar shapes, perpendicular to the buried impurity diffusion regions 128 (i.e., in the lateral direction of FIG. 9), and the pad conductive layers 114c, which are isolated in the channel regions. In other words, they are formed in the regions between the buried impurity diffusion regions 128, which are overlapped by the word lines 138.

The pad conductive layers 114c and the word lines 138 are preferably etched simultaneously using the same etching process, so that the pad conductive layers 114c are formed to be self-aligned with the word lines 138. The word lines 138 then act as the gate electrodes of the cell transistors.

During the photolithography process for the word lines 138, an NMOS gate 140 and a PMOS gate 142, which form a peripheral circuit device, are preferably formed simultaneously in the peripheral circuit region.

Insulation spacers (not shown) are then formed on the sidewalls of the word lines 138 and pad conductive layers 114c. Subsequently, impurity ions having the same conductivity as that of the semiconductor substrate are implanted into a region of the substrate, where neither the buried impurity diffusion regions 128 nor the word lines 138 are formed, to form a cell isolation impurity region (not shown). Ion implantation for cell programming is then preferably carried out.

Second Preferred Embodiment

FIGS. 22 through 25 are sectional views illustrating a method of fabricating a mask ROM having buried impurity diffusion regions according to a second preferred embodiment of the present invention, and in particular, illustrating in greater detail the formation of the pad conductive layer patterns and the grown insulation layer. In the present embodiment, the etching process for the conductive layer pattern is performed after the formation of spacers, rather than immediately after the formation of a first etch mask layer.

Figure 22:
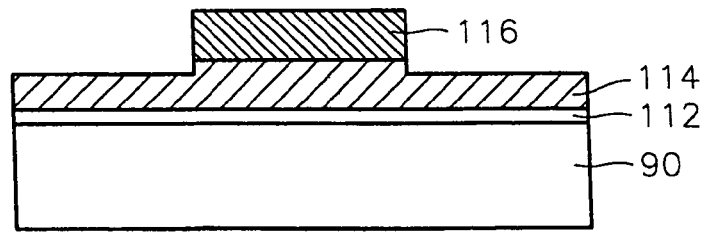
FIGS. 22 through 25 are sectional views sequentially illustrating a method of fabricating a mask ROM having buried impurity diffusion regions according to a second preferred embodiment of the present invention, and in particular illustrating in greater detail the formation of pad conductive layers and grown insulation layers.

First, referring to FIG. 22, a conductive material layer 114 for a pad conductive layer is formed over a gate insulation layer 112 formed on a semiconductor substrate 90, and a first etch mask layer 116 is formed on the conductive material layer 114. The thickness of each layer is the same as that illustrated in the first preferred embodiment. During the formation of the first etch mask layer 116, the thickness of the remaining conductive material layer 114 is adjusted to be 300 to 450 Å, but preferably the remaining conductive material layer 114 is formed to be as thin as possible within the range of a subsequent processing margin.

Figure 23:
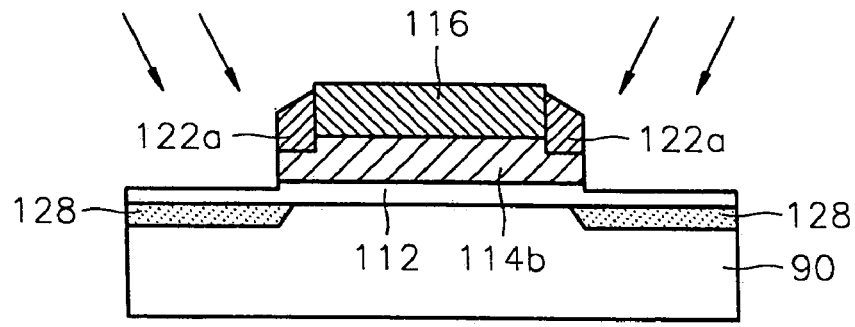

Referring to FIG. 23, a silicon nitride layer is formed over the entire surface of the resultant structure to have a thickness of, for example, 100 to 150 Å, and is subjected to anisotropic etching to form spacers 122a on the sidewalls of the first etch mask layer 116. The purpose of forming the spacers 122a is to ensure a sufficient channel length of the cell transistor. Thus if photolithography for forming the first etch mask layer 116 can ensure the critical dimension (CD) that corresponds to the sufficient channel length, the formation of the spacers 122a may be omitted. The resultant structure is subjected to an etching process using the first etch mask layer 116a and the spacers 122a as an etching mask, which results in conductive layer patterns 114b. Then, impurities such as arsenic (As) ions are symmetrically implanted to form buried impurity diffusion regions 128 on both sides of the conductive layer pattern 114b. The reason for such a symmetric impurity implantation around the conductive layer pattern 114b is to minimize a possible deformation of the conductive layer pattern 1114b.

Figure 24:
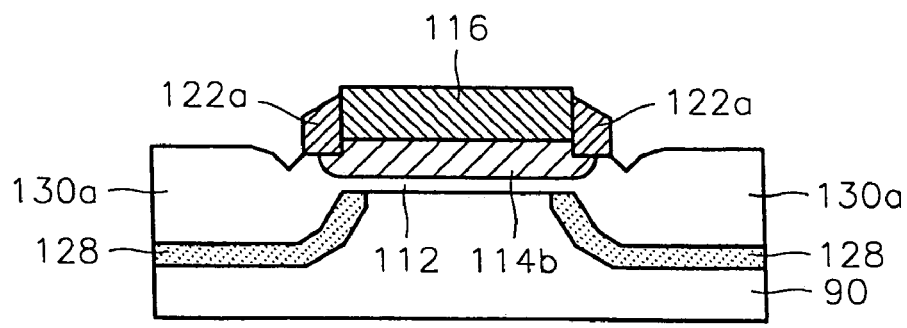

Referring to FIG. 24, an oxide layer is grown over the surface of the buried impurity diffusion regions 128, which results in grown insulation layers 130a made of silicon dioxide. During the growth process, the conductive layer pattern 114b beneath the spacers 122a is partially oxidized. Accordingly, the grown insulation layers 130a have horn portions at the edge thereof between the buried impurity diffusion region 128 and the conductive layer pattern 114b.

Figure 25:
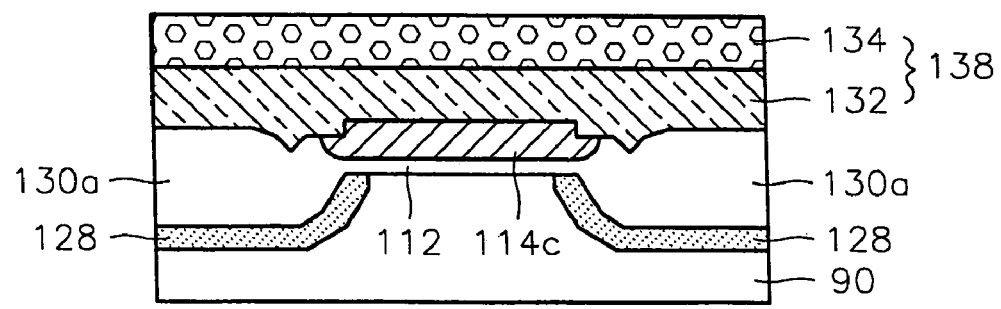

Referring to FIG. 25, the resultant structure is subjected to wet etching in an etchant of, for example, phosphoric acid ($H_3PO_4$), to remove the spacers 122a and the first etch mask layer 116 shown in FIG. 24. Then, a conductive material capable of forming an ohmic contact with the conductive layer pattern 114b is deposited over the entire surface of the resultant structure to form a conductive layer for the word lines. For example, the conductive layer may be formed of a polycide which includes a polysilicon layer 132 and a metal silicide layer 134 thereon.

The resultant structure is then patterned to form word lines 138 and pad conductive layers 114c. As a result, the grown insulation layers 130a having horn portions at the edge thereof are completed. Accordingly, the grown insulation layer 130a between the edge of the pad conductive layer 114c and the buried impurity diffusion region 128 is thick enough to avoid the occurrence of leakage current, which ensures the production of a cell transistor with a high reliability. The groove regions of the grown insulation layer 130a have a width of 20 to 30 Å and depth of 100 to 150 Å. Therefore, the polysilicon layer 132 deposited on the groove regions of the grown insulation layer 130a can be completely removed by over-etching performed to form the word lines.

Third Preferred Embodiment

In the second preferred embodiment, word lines, which act as the gate electrodes of cell transistors, are formed in a structure where polycide layers, i.e., the first polysilicon layer, a second polysilicon layer, and a metal silicide layer, are sequentially stacked. Unlike in the first preferred embodiment where the conductive layers are formed as patterns (i.e., the pad conductive layers 114c) in the channel regions of cells, the first polysilicon layer of the second preferred embodiment is arranged extending in the same direction with the same pattern as that of the word lines. Here, the first polysilicon layer is preferably formed to a thickness of, e.g., 100–1000 Å, which is thick enough to act as an anti-reflective layer (ARL).

Figure 26:
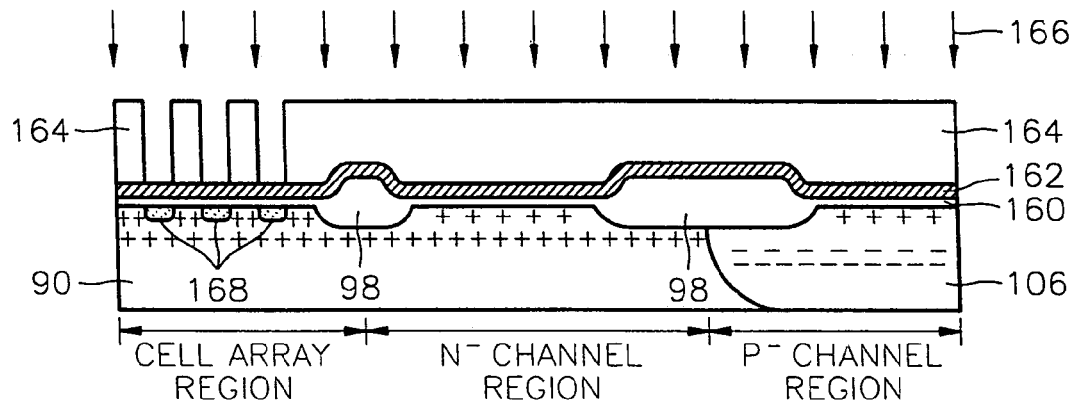
FIGS. 26 through 28 are sectional views sequentially illustrating a method of fabricating a mask ROM having buried impurity diffusion regions according to a second preferred embodiment of the present invention.
Figure 27:
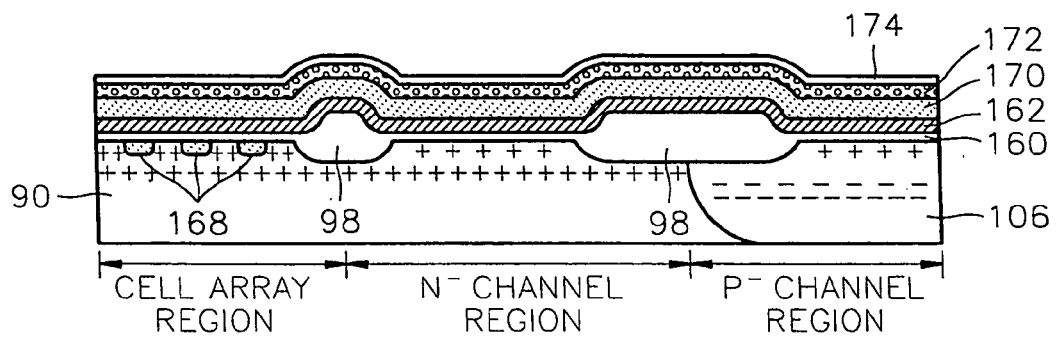
Figure 28:
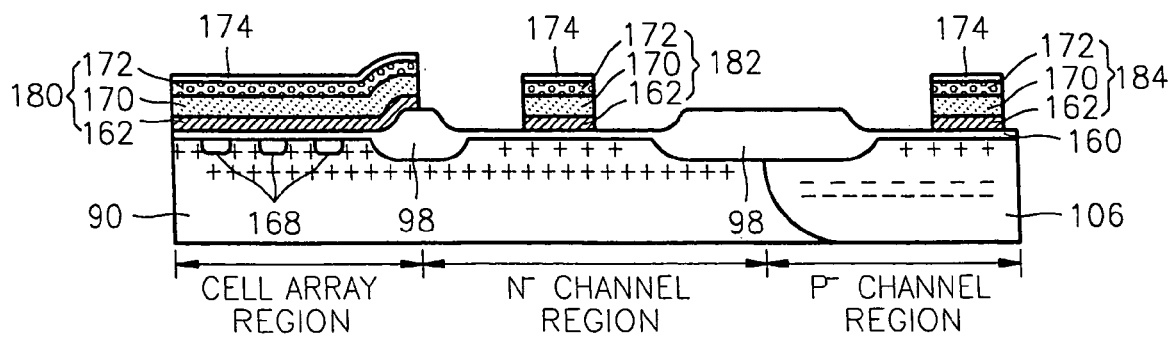

FIGS. 26 through 28 are sectional views sequentially illustrating a method of fabricating a mask ROM having buried impurity diffusion regions according to the second preferred embodiment of the present invention. First, referring to FIG. 26, after the processes described with reference to FIGS. 14 through 17 are carried out in the same manner as in the first preferred embodiment, the third photoresist pattern 108 (see FIG. 17) and the pad oxide layer 92 are removed. A sacrificial oxidation process is then carried out to form and then remove a sacrificial oxide layer on and from the entire resultant surface. This has the effect of removing defects that may be present on the surface of the semiconductor substrate 90.

A gate insulation layer 160 is then formed of, e.g., silicon dioxide, over the resultant substrate surface to a thickness of, e.g., 50–150 Å. A first polysilicon layer 162 is the deposited over the gate insulation layer 160. The first polysilicon layer 162 is preferably formed to a thickness of about 100–1000 Å, which is thick enough to act as an ARL layer during a subsequent photolithography process. In addition, the first polysilicon layer 162 protects the gate insulation layer 160 from damage that may occur in a subsequent process for forming photoresist patterns 164.

Following these steps, a photoresist layer is deposited over the first polysilicon layer 162, and is then subjected to a photo and development process. This results in the formation of photoresist patterns 164 that cover the entire peripheral circuit region but are patterned in the cell array region, as are the patterns 72 shown in FIG. 9.

Impurity ions 166 are then implanted into the entire surface of the resultant structure using the photoresist pattern 164 as a mask, to form bar-shaped buried impurity diffusion regions 168 near the surface of the semiconductor substrate 90. The buried impurity diffusion regions 168, which are parallel and separated from each other by a predetermined interval, act as the sources/drains of cell transistors and as bit lines.

According to a conventional technique, the sources/drains of cell transistors, i.e., buried impurity diffusion regions, are formed prior to the formation of the gate insulation layer and the gate electrode. However, in the second preferred embodiment, the gate insulation layer and the gate electrode (the first polysilicon layer 162) are formed first, and then the buried impurity diffusion regions 168 are formed. As a result, this avoids the problems of auto doping and OED.

Referring to FIG. 27, after the removal of the photoresist pattern 164 (see FIG. 26), a second polysilicon layer 170 and a metal silicide layer 172 made of a material such as tungsten silicide (WSi), are deposited, preferably to thicknesses of about 500–1500 Å and 100–1000 Å, respectively. Then, a material such as silicon nitride is deposited over the metal silicide layer 172 to form an etch mask layer 174. In order to provide conductivity to the first and second polysilicon layers 162 and 170, the second polysilicon layer 170 is preferably doped with impurity ions, such as $POCl_3$ ions.

Referring to FIG. 28, the etch mask layer 174 and the layers below the etch mask layer 174, i.e., the first and second polysilicon layers 162 and 170 and the metal silicide layer 172, are sequentially etched using a photolithography processes that has a mask (not shown) with a pattern for forming the word lines 80 (see FIG. 9), to form word lines 180 that act as the gate electrodes of cell transistors. The word lines 180, which are parallel and separated from each other by a predetermined interval, extend in a bar shape, perpendicular to the buried impurity diffusion regions 168.

During the photolithography process for forming the word lines 180, an NMOS gate 182 and a PMOS gate 184, which form a peripheral circuit device, are preferably formed simultaneously in the peripheral circuit region. Processes following the word line formation are preferably the same as in the first embodiment, and so a description of these processes will be omitted.

The third preferred embodiment avoids a decrease in length of the channel regions caused by auto doping and OED, because the buried impurity diffusion regions 168 are formed after the formation of the gate insulation layer 160 and the first polysilicon layer 162. Furthermore, the first polysilicon layer 162 can be used as an ARL layer during the photolithography process. Thus, the present embodiment allows the manufacture of a highly integrated cell.

As described above, the present invention relating to the mask ROM and the fabrication of such a device is characterized in that the buried impurity diffusion regions are formed prior to the formation of the gate insulation layer. As a result, this avoids the impurity ion diffusion (the auto doping phenomenon) in the buried impurity diffusion regions caused by the heat energy provided during the gate insulation layer formation. In addition, this prevents the diffusion of the impurity ions of the n-type buried impurity diffusion regions into the substrate caused by the OED during the gate insulation layer formation, thereby minimizing the pitch of the buried impurity diffusion regions to a limit level of the photolithography.

As another feature of the present invention, the buried impurity diffusion regions according to the present invention are formed to have a DDD structure, in which the high-concentration impurity diffusion regions are surrounded by the low-concentration buried impurity diffusion regions. This reduces the parasitic junction capacitance between the semiconductor substrate and the buried impurity diffusion regions. In addition, by forming the grown insulation layer between the buried impurity diffusion regions and the word lines, the parasitic capacitance between these two can be reduced, thereby improving the electrical characteristics of devices.

While the present invention has been illustrated and described with reference to specific embodiments, further modifications and alterations within the spirit and scope of this invention will occur to those skilled in the art.

What is claimed is:

1. A method of fabricating a mask read only memory, comprising:

forming a gate insulation layer over a semiconductor substrate;

forming a first polysilicon layer over the gate insulation layer;

forming photoresist patterns over the first polysilicon layer, which entirely cover a peripheral circuit region but are patterned in a cell array region to expose regions that are to become buried impurity diffusion regions;

performing ion implantation using the photoresist patterns as a mask to form a plurality of buried impurity diffusion regions near the surface of the semiconductor substrate, wherein the buried impurity diffusion regions are formed in parallel, are separated from each other by a first predetermined interval, and extend in the same direction;

removing the photoresist patterns, and sequentially stacking a second polysilicon layer and a metal silicide layer over the first polysilicon layer; and sequentially etching the first and second polysilicon layers and the metal suicide layer so as to form a plurality of word lines, wherein the word lines are formed in parallel, are separated from each other by a second predetermined interval, and extend in a direction perpendicular to that of the buried impurity diffusion regions.

2. A method of fabricating a mask read only memory, as recited in claim 1, wherein the buried impurity diffusion regions act as bit lines and as sources/drains of cell transistors.

3. A method of fabricating a mask read only memory, as recited in claim 1, further comprising doping first and second polysilicon layers with $POCl_3$ ions so as to provide conductivity to the first and second polysilicon layers.

4. A method of fabricating a mask read only memory, as recited in claim 1, wherein the gate insulation layer is formed to a thickness of about 50–150 Å, the first polysilicon layer is formed to a thickness of about 100–1000 Å, the second polysilicon layer is formed to a thickness of about 500–1500 Å, and the metal silicide layer is formed to a thickness of about 500–2000 Å.

* * * * *